United States Patent
Hsu et al.

(10) Patent No.: US 7,608,529 B2
(45) Date of Patent: Oct. 27, 2009

(54) METHOD FOR SELECTIVE LASER CRYSTALLIZATION AND DISPLAY PANEL FABRICATED BY USING THE SAME

(75) Inventors: Tsung-Yi Hsu, Changhua County (TW); Chih-Hsiung Chang, Taichung County (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 11/987,445

(22) Filed: Nov. 30, 2007

(65) Prior Publication Data

US 2008/0090340 A1    Apr. 17, 2008

Related U.S. Application Data

(62) Division of application No. 11/258,910, filed on Oct. 27, 2005, now abandoned.

(30) Foreign Application Priority Data

Dec. 10, 2004  (TW) .............................. 93138423 A

(51) Int. Cl.
*H01L 21/20* (2006.01)
*H01L 21/36* (2006.01)

(52) U.S. Cl. .................. 438/487; 438/482; 438/486

(58) Field of Classification Search ............... 438/482, 438/486, 487, 488; 117/7–9
See application file for complete search history.

(56) References Cited

U.S. PATENT DOCUMENTS

| 5,550,070 | A | * | 8/1996 | Funai et al. ............. 438/486 |
| 5,835,606 | A | | 11/1998 | Marie et al. |
| 6,835,606 | B2 | * | 12/2004 | Peng et al. ............. 438/154 |
| 2003/0057418 | A1 | * | 3/2003 | Asano ..................... 257/66 |
| 2003/0211714 | A1 | * | 11/2003 | Yamazaki et al. ....... 438/487 |
| 2003/0224550 | A1 | * | 12/2003 | Kokubo et al. .......... 438/48 |
| 2004/0013019 | A1 | * | 1/2004 | Otose ..................... 365/202 |
| 2004/0197968 | A1 | * | 10/2004 | Peng et al. ............. 438/154 |
| 2004/0233340 | A1 | | 11/2004 | Makimura et al. |

FOREIGN PATENT DOCUMENTS

TW           587295           5/2004

* cited by examiner

*Primary Examiner*—Ha Tran T Nguyen
*Assistant Examiner*—Valerie Brown
(74) *Attorney, Agent, or Firm*—Bacon & Thomas, PLLC

(57) ABSTRACT

A display panel comprises a substrate having a displaying region (such as active organic light emitting region) and a circuit driving region; and a polysilicon layer formed on the substrate and having a first polysilicon portion and a second polysilicon portion respectively corresponding to the displaying region and circuit driving region, wherein the grain size of the second polysilicon portion crystallized by continuous wave (CW) laser annealing method is larger than that of the first polysilicon portion crystallized by excimer laser annealing (ELA) method.

9 Claims, 3 Drawing Sheets

METHOD FOR SELECTIVE LASER CRYSTALLIZATION AND DISPLAY PANEL FABRICATED BY USING THE SAME

This application is a divisional application of pending U.S. application Ser. No. 11/258,910 filed Oct. 27, 2005.

BACKGROUND OF THE INVENTION

1. Field of the Invention

The invention relates in general to a display panel and fabricating method thereof, and more particularly to a method for transforming amorphous silicon to poly-silicon by selective laser crystallization and the display panel fabricated by using the same.

2. Description of the Related Art

According to the circuit driving method, the organic light emitting diode display panel can be divided into two groups. One is a passive matrix organic light emitting diode display panel (PMOLED display panel), and the other group is an active matrix organic light emitting diode display panel (AMOLED display panel). The thin film transistor (TFT) and the storage capacitor are used in the AMOLED to control the gray scale performance of the organic light emitting device (OLED).

Generally, the PMOLED has the advantages of low production cost and simple technique, but the inefficient drive current results in the low resolution of the display. Also, the brightness of the lighten pixel of the PMOLED cannot be well maintained. Thus, the PMOLED is usually applied to the product less than 5-inch. On the contrary, the brightness of the lighten pixel of the AMOLED can be well maintained since the storage capacitor is disposed in the AMOLED. Thus, it is no need to drive the OLED to emit the light having high brightness, so that the useful life of the AMOLED is longer than that of the PMOLED. Also, the AMOLED can achieve the requirement of high resolution. Moreover, the circuit drive of the AMOLED is more efficient than that of the PMOLED, and the pixels and TFTs of the AMOLED can be integrated on the glass substrate.

The techniques for manufacturing TFT on the glass substrate include the amorphous silicon (a-Si) process and the low temp polysilicon (LTPS) process. The major differences between the a-Si process and the LTPS process are the electrical characteristics of devices and the complexity of processes. The LTPS TFT possesses higher mobility, but the process for fabricating the LTPS TFT is more complicated. Although the a-Si TFT possesses higher mobility, the process for fabricating the a-Si TFT is simple.

Several methods, including the excimer laser annealing (ELA) method, continuous grain silicon (CGS) method, continuous wave (CW) laser method, sequential lateral solidification (SLS) method and metal induced lateral crystallization (MILC) method, have been suggested to turn the amorphous silicon layer into the polysilicon film. The laser beam, such as an excimer laser, a continuous wave (CW) laser or laser beam pulse, can be used for irradiating the amorphous silicon layer. Recently, laser beam pulse is common in use, and the method of lateral crystallization by causing temperature gradient is also popular.

Taking the sequential lateral solidification (SLS) method for example, the use of the optical phase shift masks that have different transparency can cause a lateral temperature gradient in an amorphous silicon layer so as to induce lateral grain growth.

Additionally, the requirements for the regions of a display panel are different. For example, the AMOLED generally comprises a displaying region and a circuit driving region. Whether the current leakage occurs is critical to the displaying region, and the mobility of carriers is a key point of the electrical characteristics of the circuit driving region. Both of the grain size and grain boundary have an effect on the mobility of carriers. Conventionally, the amorphous silicon of the displaying region and the circuit driving region is turned to the polysilicon by an excimer laser beam. However, the polysilicon formed by the excimer laser beam has the irregular grain size and grain boundary, resulting in non-uniform electrical characteristics of the TFTs for driving the displaying region while the operating voltage is applied. Therefore, the image defects such as dark spot defects and dark line defects could be shown on the displaying region during displaying. Typically, the displaying region presents a more uniform image if the polysilicon layer corresponding to the circuit driving region has a larger grain size and more regular grain boundary.

Therefore, it is desirable to form no-defect silicon grains having larger size and more regular boundary, so as to increase throughput and process efficiency, and decrease the production cost.

SUMMARY OF THE INVENTION

It is therefore an object of the invention to a method for selective laser crystallization and display panel fabricated by using the same, so as to improve the electrical uniformity of the circuit driving region of the display panel and to increase the throughput.

The invention achieves the objects by providing a display panel comprising a substrate and a polysilicon layer. The substrate has a displaying region and a circuit driving region. The polysilicon formed on the substrate has a first polysilicon portion and a second polysilicon portion, respectively associated to the displaying region and the circuit driving region. The grain size of the second polysilicon portion is larger than that of the first polysilicon portion. The second polysilicon portion is formed by a continuous wave laser annealing method. The first polysilicon portion could be formed by an excimer laser annealing (ELA) method, continuous grain silicon (CGS) method, continuous wave (CW) laser method, sequential lateral solidification (SLS) method or metal induced lateral crystallization (MILC) method.

The invention achieves the objects by providing an active matrix organic light emitting diode display panel (AMOLED display panel), comprising a substrate, a scan line, a data line, a power line, a first transistor, a second transistor and a light emitting component. The scan line, the data line and the power line are disposed on the substrate. The data line is perpendicular to the scan line, and the power line is parallel to and separated from the data line by a distance. The first transistor and the second transistor are disposed on the substrate. A gate electrode of the first transistor is coupled to the scan line, and a source of the first transistor is coupled to the data line. The gate electrode of the second transistor is coupled to the drain of the first transistor, and the source of the second transistor is coupled to the power line. The light emitting component disposed on the substrate is coupled to the drain of the second transistor. An active displaying region, having a first polysilicon portion, is determined by the scan line, the data line, the power line and the light emitting component. A circuit driving region, having a second polysilicon portion, is determined by the scan line, the data line, the power line, the first transistor and the second transistor. The grain size of the second polysilicon portion is larger than that of the first polysilicon portion. The size of at least one of the grains of the second polysilicon portion is greater than about 1 micrometer, specifically, greater than about 10 micrometer. The grains of the second polysilicon portion are stripe-shaped. The grain boundary of the second polysilicon portion is sparser than the grain boundary of the first polysilicon portion.

The invention achieves the objects by providing a method for fabricating display panel. The method at least comprises steps as follows. First, a substrate having a displaying region and a circuit driving region is provided. Next, an amorphous silicon layer is deposited on the substrate, and the amorphous silicon layer has a first amorphous silicon portion and a second amorphous silicon portion respectively associated to the displaying region and the circuit driving region. Then, the second amorphous silicon portion is crystallized by a continuous wave laser beam to form a second polysilicon portion, and the first amorphous silicon portion is crystallized (for example, by an excimer laser beam) to form a first polysilicon portion.

Other objects, features, and advantages of the invention will become apparent from the following detailed description of the preferred but non-limiting embodiments. The following description is made with reference to the accompanying drawings.

DETAILED DESCRIPTION OF THE INVENTION

In the present invention, the displaying region and the circuit driving region of a display panel may be crystallized by using different laser annealing methods, so that the throughput is increased and the mobility of the carriers in the circuit driving region is improved. In the preferred embodiment, the circuit driving region is crystallized by the continuous wave (CW) laser annealing method and the displaying region crystallized by the excimer laser annealing (ELA) method, continuous grain silicon (CGS) method, sequential lateral solidification (SLS) method or metal induced lateral crystallization (MILC) method. Therefore, the polysilicon portion corresponding to the circuit driving region has a larger grain size and more regular grain boundary, resulting in good electrical characteristics, particularly in the mobility of carriers. Although the polysilicon portion corresponding to the displaying region has a smaller grain size, the crystallization process is timesaving, resulting in high throughput of display panel production.

For example, when a XeCl-excimer laser at a wavelength of 308 nm is used to scan the displaying region, the crystallization area is determined according to the magnitude of the laser beam. If the excimer laser annealing system providing a laser beam of 200 mm long and 1.5 mm wide is available, it can be applied in the fabrication of a 12.1-inch display panel. When a larger size substrate, such as 600×720 $mm^2$ or 730× 920 $mm^2$, of the display panel is provided, a laser beam of 300 mm or 365 mm long should be applied in the crystallization process.

The embodiment disclosed herein is for illustrating the invention, but not for limiting the scope of the invention. Also, an active matrix organic light emitting diode display panel (AMOLED display panel) is taken for illustration in the preferred embodiment. However, the present invention could be applied in the other panels such as the passive matrix organic light emitting diode (PMOLED) display panel or low temperature polysilicon display panel (LTPS display panel). Additionally, the drawings used for illustrating the embodiments of the invention only show the major characteristic parts in order to avoid obscuring the invention. Accordingly, the specification and the drawings are to be regard as an illustrative sense rather than a restrictive sense.

Figure 1:
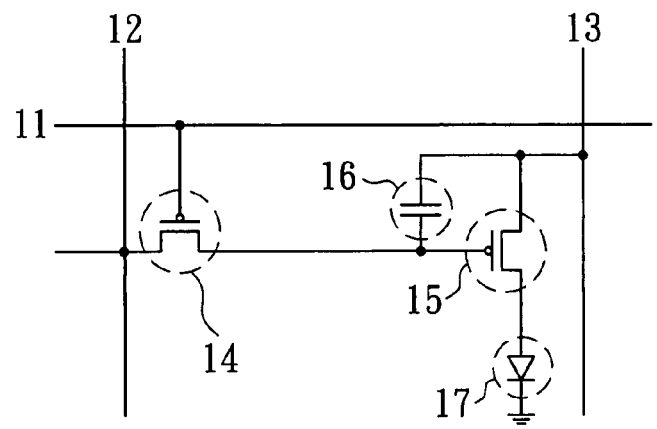
FIG. 1 is an equivalent circuit diagram of a single pixel of an active matrix organic light emitting diode display panel (AMOLED display panel) according to the embodiment of the invention.

FIG. 1 is an equivalent circuit diagram of a single pixel of an AMOLED display panel according to the embodiment of the invention. The scan line 11 is formed in one direction, and the data line 12 is perpendicular to the scan line 11. The power line 13 is parallel to and separated from the data line 12 by a distance. The displaying region (i.e. pixel region) of AMOLED display panel is positioned corresponding to the space defined by the scan line 11, the data line 12 and the power line 13. A light-emitting device 17, that is, the organic light emitting diode (OLED), is applied in the displaying region. According to the signal through the scan line 11, the first transistor 14 controls whether a signal through the data line 12 goes into the displaying region. The second transistor 15 applies a power supply of the power line 13 to the light-emitting device 17 according to a signal applied through the first transistor 14. Moreover, the capacitor 16 is coupled to the power line 13 and a gate electrode of the second transistor 15.

Figure 2:
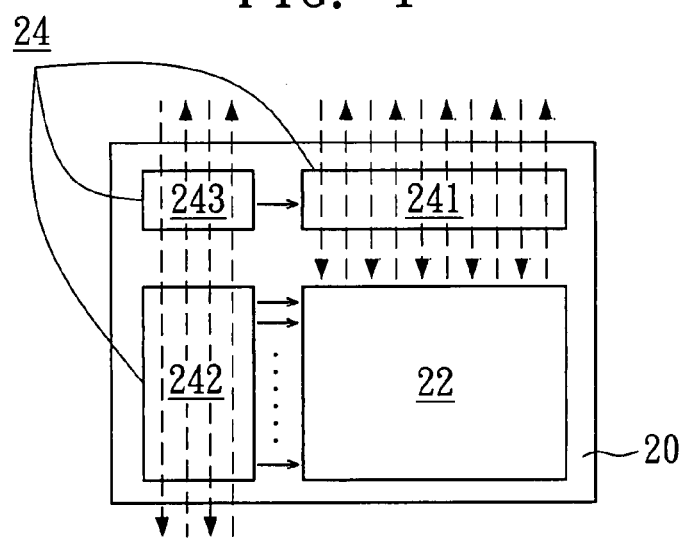
FIG. 2 and FIG. 3 illustrate the active matrix organic light emitting diode display panel (AMOLED display panel) fabricated by selective laser crystallization according to the embodiment of the invention.
Figure 3:
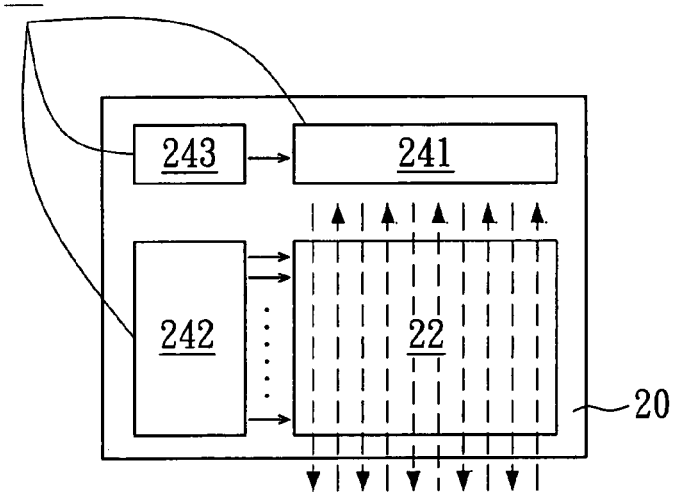

FIG. 2 and FIG. 3 illustrate the AMOLED display panel fabricated by selective laser crystallization according to the embodiment of the invention. There are a displaying region (i.e. pixel region) 22 and a circuit driving region 24 on the substrate 20. The circuit driving region 24, comprising the gate drive integrated circuits (ICs) 241, data driver ICs 242 and controller (such as the first transistor) 243, is used for driving the displaying region 22. According to this embodiment, an amorphous silicon layer is formed on the substrate first, by plasma-enhanced chemical vapor deposition (PECVD), for example. Then, the alignment marks are formed on the amorphous silicon layer by photolithography (e.g. etching), for determining the regions of laser crystallization. Next, the amorphous silicon layer correspondingly deposited on the circuit driving region 24 is crystallized and turns into polysilicon by a continuous wave (CW) laser beam, as shown in FIG. 2. The arrows of FIG. 2 indicate the scan directions of the CW laser beam.

The amorphous silicon layer correspondingly deposited on the displaying region 22 is then crystallized and turns into polysilicon using excimer laser annealing (ELA) method, for example, as shown in FIG. 3. The arrows of FIG. 3 indicate the scan directions of the ELA laser beam. After the amorphous silicon layer deposited on the substrate is laser-irradiated to form a polysilicon layer, the components such as the ICs and transistors are fabricated in the subsequent processes. Finally, an organic light emitting layer such as organic EL is deposited on the TFT device by thermal evaporator, for making an AMOLED display panel.

Figure 4:
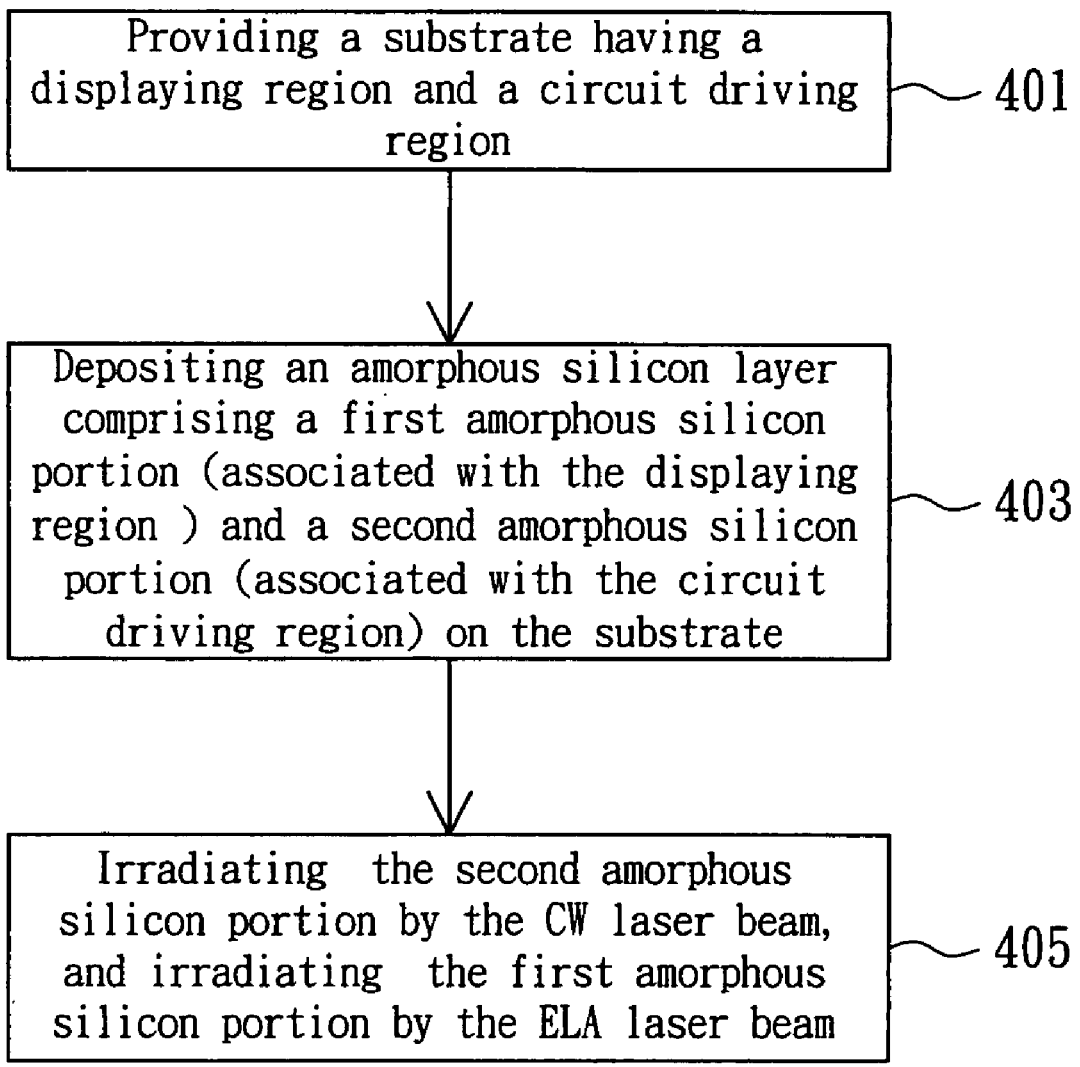
FIG. 4 is a process diagram for fabricating the display according to the embodiment of the invention.

FIG. 4 is a process diagram for fabricating the display according to the embodiment of the invention. The fabricating method at least comprises the steps described below. First, a substrate having a displaying region and a circuit driving region is provided, in step 401. Then, an amorphous silicon layer, comprising a first amorphous silicon portion and a second amorphous silicon portion, is deposited on the substrate, in step 403. The first and second amorphous silicon portions are associated with the displaying region and the circuit driving region, respectively. Also, an alignment mark is formed on the amorphous silicon layer by photolithography (e.g. etching), for determining the regions of laser crystallization. Next, the second amorphous silicon portion is irradiated by the CW laser beam to form a second polysilicon portion, and the first amorphous silicon portion is irradiated by the ELA laser beam to form a first polysilicon portion, in step 405. Afterward, a first transistor and a second transistor can be formed at the circuit driving region of the substrate, and an electroluminescence component, such as an organic light emitting diode, is formed by coupling to the second transistor.

According to the fabricating method described above, the grain size of the second polysilicon portion at the circuit driving region 24 comprising the gate drive ICs 241, data driver ICs 242 and controller 243 thereon is larger than the grain size of the first polysilicon portion at the displaying region. Also, the grain boundary of the circuit driving region 24 is more regular than that of the displaying region, so that the mobility of carriers in polysilicon of the circuit driving region 24 is increased, and the homogeneity of electrical characteristics of TFT is greatly improved. Moreover, the displaying region, which occupies the most area of the substrate, crystallized by the time-saving ELA technique can decreasing the production time (i.e. time for growing the grains on the whole substrate), thereby increasing the throughput of polysilicon formation. The grain size of the second polysilicon portion is larger than that of the first polysilicon portion. The size of at least one of the grains of the second polysilicon portion is greater than about 1 micrometer, specifically, greater than about 10 micrometer. Also, the grains of the second polysilicon portion are stripe-shaped. The grain boundary of the second polysilicon portion is sparser than the grain boundary of the first polysilicon portion. Besides, the method mentioned above can be applied in LTPS display.

Although the first amorphous silicon portion is irradiated by the ELA laser beam to form the first polysilicon portion according to the embodiment described above, it is noted that the first polysilicon portion could be also formed by continuous grain silicon (CGS) method, continuous wave (CW) laser method, sequential lateral solidification (SLS) method or metal induced lateral crystallization (MILC) method, depending on the practical application.

Figure 5:
FIG. 5 is the first SEM (scanning electron microscope) photo showing the polysilicon crystallized by CW laser.
Figure 6:
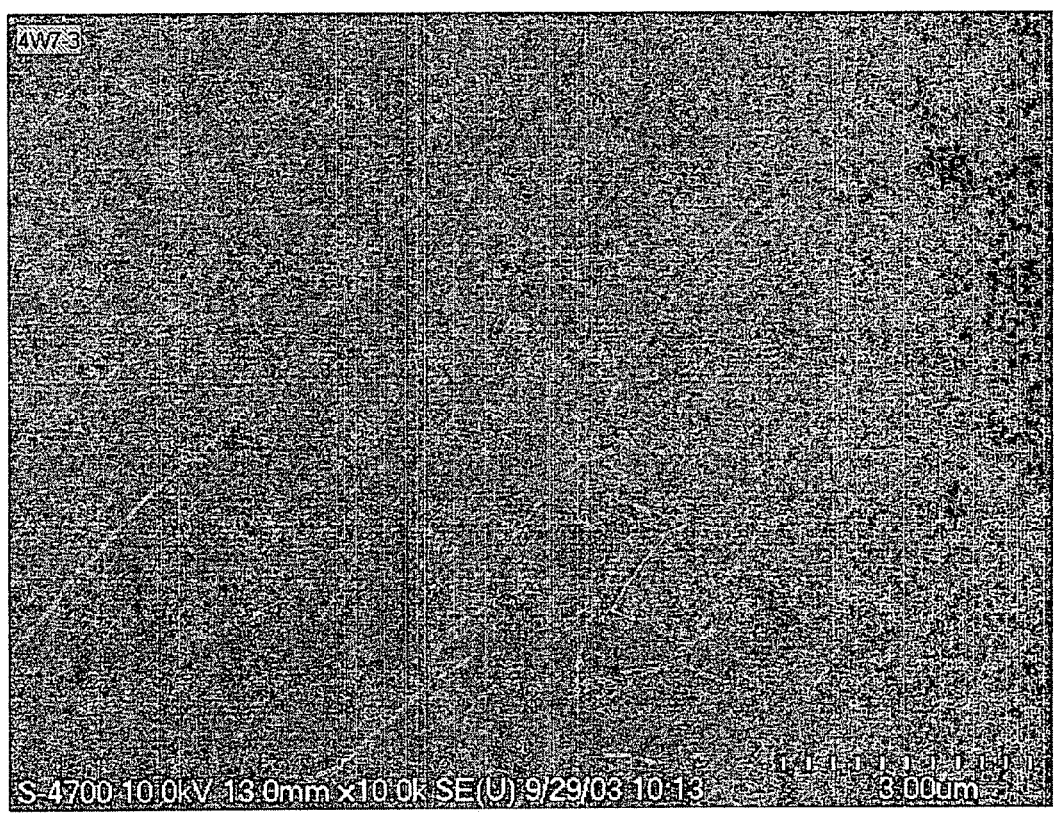
FIG. 6 is the second SEM photo showing the polysilicon crystallized by CW laser.

FIG. 5 is the first SEM (scanning electron microscope) photo showing the polysilicon crystallized by CW laser. It is shown that polysilicon crystallized by CW laser has uniform grain sizes, so as to present a fine flow pattern. Moreover, the grain boundary of polysilicon formed by CW laser is sparser than that of polysilicon formed by ELA laser. FIG. 6 is the second SEM photo showing the polysilicon crystallized by CW laser. FIG. 6 clearly shows that the polysilicon crystallized by CW laser possesses a regular grain boundary, and the grains are stripe-shaped. Also, the size of at least one of the grains of the second polysilicon portion is greater than about 1 μm, specifically, greater than about 10 μm. Because of the particular crystallization, the polysilicon grains grown using CW laser usually turns aside from the scan direction. According to the aforementioned descriptions, the selective laser crystallization (i.e. the circuit driving region crystallized by CW laser and the displaying region crystallized by ELA laser, for example) of the embodiment can grow the polysilicon of the circuit driving region having a larger grain size. According to the experimental data, the grain size of circuit driving region is at least about 1 μm, specifically, at lease about 10 μm, and the grain size of displaying region is about 0.2~1.0 μm. Also, polysilicon of the circuit driving region has more regular grain boundary, so that the mobility of the carriers is increased. Moreover, the overall time for forming the polysilicon on the substrate is short, since most area of the substrate (occupied by the displaying region) is crystallized using the quick ELA technique. Therefore, the uniformity of electrical characteristics of TFT is improved, the throughput is increased, and the production cost is decreased, by applying the present invention.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a display panel, comprising:
   providing a substrate having a displaying region and a circuit driving region;
   depositing an amorphous silicon layer on the substrate, and the amorphous silicon layer having a first amorphous silicon portion and a second amorphous silicon portion respectively associated to the displaying region and the circuit driving region;
   crystallizing only the second amorphous silicon portion by a continuous wave laser beam to form a second polysilicon portion; and
   crystallizing the first amorphous silicon portion excluding the second amorphous silicon portion to form a first polysilicon portion, wherein the crystallizing methods applied to the first amorphous silicon portion and the second amorphous silicon portion are different.

2. The method according to claim 1, further comprising:
   forming an alignment mark on the amorphous silicon layer by photolithography.

3. The method according to claim 1, wherein after the first and the second polysilicon portions are formed, the method further comprises:
   forming a first transistor and a second transistor at the circuit driving region of the substrate; and
   forming an electroluminescence component coupled to the second transistor.

4. The method according to claim 3, wherein the electroluminescence device is an organic light emitting diode.

5. The method according to claim 3, wherein at least one of the first polysilicon portion and the second polysilicon portion is comprised of low-temperature polysilicon (LTPS).

6. The method according to claim 1, wherein at least one of the first polysilicon portion and the second polysilicon portion is comprised of low-temperature polysilicon (LTPS).

7. The method according to claim 1, wherein the step of crystallizing the first amorphous silicon portion to form the first polysilicon portion comprises crystallizing the first amorphous silicon portion by an excimer laser to form the first polysilicon portion.

8. The method according to claim 1, wherein the step of crystallizing the first amorphous silicon portion to form the first polysilicon portion comprises crystallizing the first amorphous silicon portion by a laser beam pulse to form the first polysilicon portion.

9. The method according to claim 1, wherein the step of crystallizing the first amorphous silicon portion to form the first polysilicon portion comprises crystallizing the first amorphous silicon portion by a continuous grain silicon (CGS) method, a sequential lateral solidification (SLS) method, excimer laser annealing (ELA) method or a metal induced lateral crystallization (MILC) method to form the first polysilicon portion.

* * * * *